United States Patent
Mattila

(10) Patent No.: US 10,690,331 B2
(45) Date of Patent: Jun. 23, 2020

(54) LUMINAIRE CIRCUIT BOARD AND METHOD FOR MANUFACTURING A LUMINAIRE CIRCUIT BOARD

(71) Applicant: Teknoware Oy, Lahti (FI)

(72) Inventor: Harri Mattila, Lahti (FI)

(73) Assignee: Teknoware OY, Lahti (FI)

( * ) Notice: Subject to any disclaimer, the term of this patent is extended or adjusted under 35 U.S.C. 154(b) by 0 days.

(21) Appl. No.: 15/949,742

(22) Filed: Apr. 10, 2018

(65) Prior Publication Data

US 2018/0292073 A1 Oct. 11, 2018

(30) Foreign Application Priority Data

Apr. 10, 2017 (FI) ...................... 20175331

(51) Int. Cl.

| | | |
|---|---|---|
| F21V 23/00 | (2015.01) | |
| F21V 19/00 | (2006.01) | |
| H05K 3/30 | (2006.01) | |
| H05K 1/18 | (2006.01) | |
| F21V 19/04 | (2006.01) | |
| H05B 45/40 | (2020.01) | |
| F21Y 115/10 | (2016.01) | |
| F21Y 103/10 | (2016.01) | |
| H01L 25/16 | (2006.01) | |

(52) U.S. Cl.
CPC ........ *F21V 23/005* (2013.01); *F21V 19/0015* (2013.01); *F21V 19/04* (2013.01); *H05B 45/40* (2020.01); *H05K 1/181* (2013.01); *H05K 3/303* (2013.01); *F21Y 2103/10* (2016.08); *F21Y 2115/10* (2016.08); *H01L 25/167* (2013.01); *H05K 2201/10106* (2013.01); *H05K 2201/10522* (2013.01)

(58) Field of Classification Search
CPC ...... F21V 19/047; F21V 23/005; F21K 9/238; F21K 9/278; H05B 39/10; H05B 39/105; H05K 3/303; H05K 3/305
USPC ........................................................ 362/207
See application file for complete search history.

(56) References Cited

U.S. PATENT DOCUMENTS

| | | | | |
|---|---|---|---|---|
| 5,309,336 A | * | 5/1994 | Hartt ................... | F21V 21/0965 320/114 |
| 6,354,715 B1 | * | 3/2002 | Halasz .................... | F21L 4/005 362/187 |
| 8,511,851 B2 | * | 8/2013 | Van de Ven ....... | H05B 33/0863 362/230 |

(Continued)

FOREIGN PATENT DOCUMENTS

| | | |
|---|---|---|
| CN | 204739513 | 11/2015 |
| JP | 2006-303283 | 11/2006 |

(Continued)

*Primary Examiner* — William N Harris
(74) *Attorney, Agent, or Firm* — BakerHostetler

(57) ABSTRACT

A luminaire circuit board and a method for manufacturing a luminaire circuit board. The luminaire circuit board comprises a first set of light source components fastened onto a circuit board and coupled to a circuit for producing illumination. The luminaire circuit board further comprises a second set of light source components, which have substantially the same colour temperature as the light source components of the first set and which are fastened onto the circuit board as electrically isolated from said circuit.

12 Claims, 1 Drawing Sheet

FIG. 1

(56) References Cited

U.S. PATENT DOCUMENTS

| | | | |
|---|---|---|---|
| 8,783,901 B2* | 7/2014 | Zoorob | F21K 9/00 |
| | | | 362/230 |
| 2002/0168892 A1* | 11/2002 | Frederick | F21S 9/04 |
| | | | 439/501 |
| 2008/0130275 A1 | 6/2008 | Higley et al. | |
| 2008/0211415 A1* | 9/2008 | Altamura | H05B 37/036 |
| | | | 315/192 |
| 2009/0129077 A1* | 5/2009 | Janning | H05B 37/036 |
| | | | 362/234 |
| 2010/0109538 A1* | 5/2010 | Peng | H05B 37/036 |
| | | | 315/185 R |
| 2014/0183575 A1 | 7/2014 | Miyata | |
| 2015/0338041 A1 | 11/2015 | Wimmer et al. | |
| 2016/0010834 A1 | 1/2016 | Pohs | |

FOREIGN PATENT DOCUMENTS

| | | |
|---|---|---|
| WO | WO-2008/036873 | 3/2008 |
| WO | WO-2011/105670 | 9/2011 |

* cited by examiner

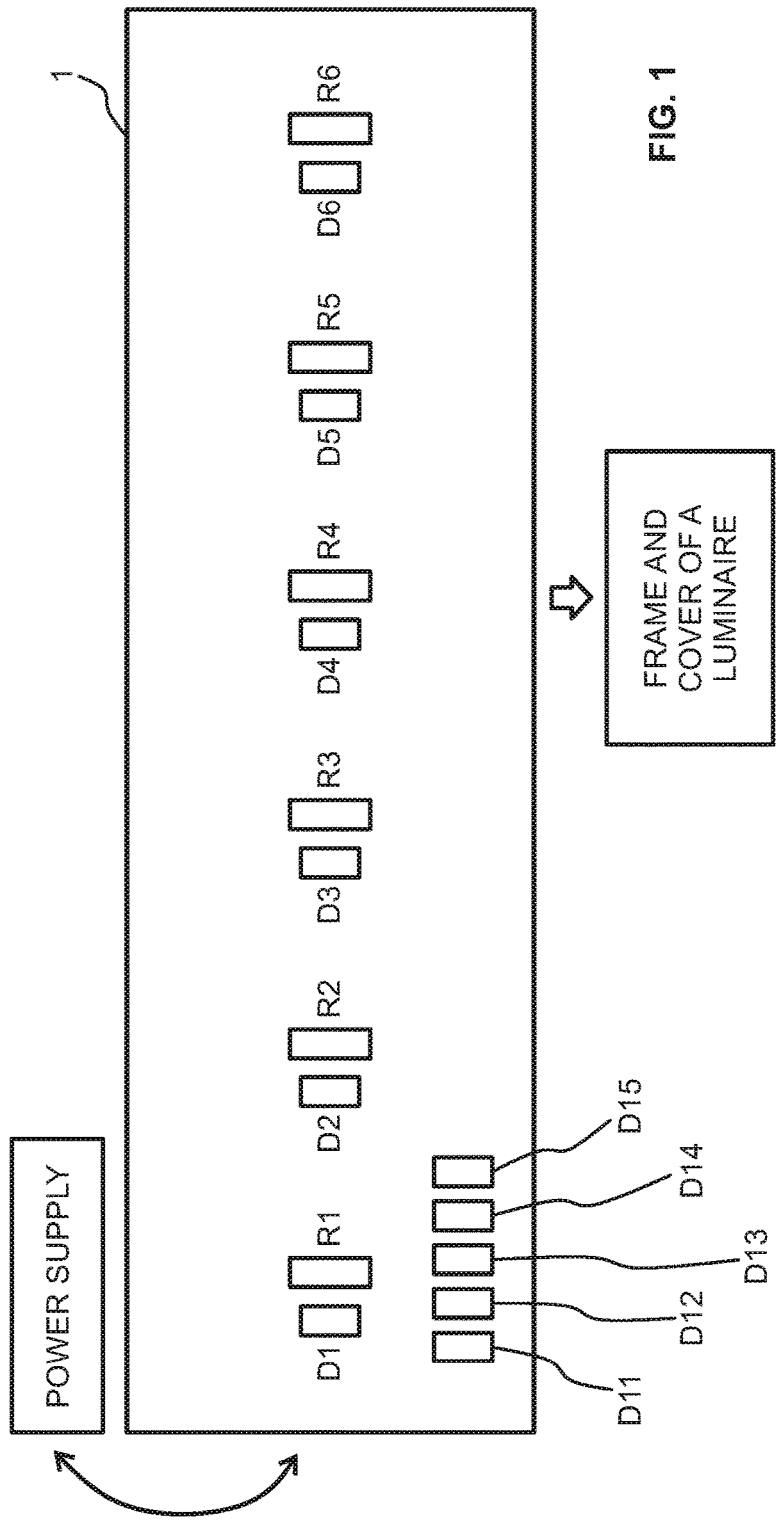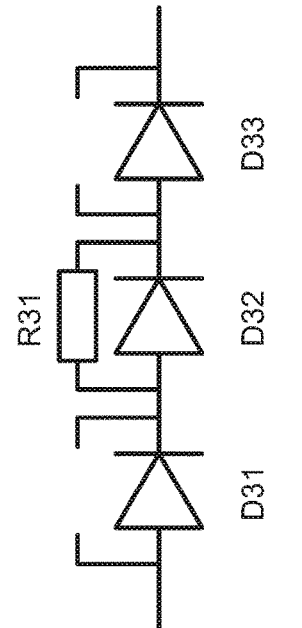
FIG. 1
FIG. 2

LUMINAIRE CIRCUIT BOARD AND METHOD FOR MANUFACTURING A LUMINAIRE CIRCUIT BOARD

CROSS-REFERENCE TO RELATED APPLICATIONS

This application claims priority to and the benefit of Finish Application No. FI-20175331, filed Apr. 10, 2017, the disclosure of which is hereby incorporated by referenced in its entirety.

FIELD OF THE INVENTION

The invention relates to luminaire circuit boards and, more specifically, to luminaire circuit boards containing LED light sources.

PRIOR ART

In many illumination objects, LED components are used to produce light due to the advantages associated with these. The advantages of LED components are good luminous efficacy, energy savings, long service life and simple controllability. Further, in comparison to incandescent or fluorescent lamp solutions, LED-based luminaires are smaller in physical size and, for this reason, also lighter in weight. For example, in the interior illumination of public transportation, the use of LED-based luminaires has become more common because of the advantages presented above.

One manner of implementing LED-based luminaires is to place the LED light sources and the coupling required for their control onto a circuit board or equivalent. Onto such a circuit board, the required coupling is formed and the LED components are fastened integrally with the coupling. When a luminaire circuit board obtained thus is connected to a power source, the LED components produce light. A luminaire circuit board is further used for forming a luminaire, for example, such that the luminaire circuit board is placed or sealed between a separate frame part and a cover part. One type of luminaire circuit board can be used in various luminaires.

As the disadvantage of LED-based luminaires is the colour temperature dispersion of the white light to be produced between different LED components. One luminaire circuit board has several LED components producing illumination. The LED components can be, for example, at 5 cm intervals on a board 50 cm long, and the object is to produce light of a uniform colour temperature with each LED component. The luminaire does not look uniform if the colour temperature of one or more light-producing components differs from the colour temperature of the other components in a significant manner.

LED manufacturers have sought to decrease colour temperature dispersion between different manufacturing batches (so-called colour binning), but it has not been possible to entirely eliminate the problem. MacAdam ellipses have been developed to represent noticeable colour differences. The colour temperature of two LED components being within one MacAdam step, there is no noticeable difference in the colour temperature. When there are 2-3 MacAdam steps between the colour temperatures of the light produced by components, there is a hardly noticeable difference in colour temperature, and when the difference is more than 3 MacAdam steps, the colour difference is noticeable.

Component manufacturers are capable of providing colour binnings within 3 MacAdam steps. However, some people are capable of observing colour differences even between LED components that are within 3 MacAdam steps.

LED components are functionally highly reliable and the MTBF value of one LED component is approximately 10 000 000 h. A catastrophic component failure conventionally occurs at the starting end of the service life due to, for example, a wrong type of mechanical stress during the installation phase of the LED circuit board. While in use, the colour temperature of a LED component does not significantly change, even though the luminous flux produced by the component decreases over time.

When a LED component on a luminaire circuit board fails, the corresponding component can be exchanged for a new, equivalent component. Although component manufacturers strive to produce components such that there are no variations in colour temperature greater than 3 MacAdam steps between manufacturing batches, it is often difficult to find a new component of the same colour binning. This is due to the quickly-developing manufacturing processes of LED components and the relatively low commercial availability of LED components. For this reason, either the luminaire circuit board manufacturers or the luminaire circuit board users often have spare part boards in storage, which can be used to replace a failed board, instead of trying to find a LED component of suitable colour temperature for a failed board. However, spare part boards needlessly tie up the capital of the manufacturers in the form of both storage and component expenses.

BRIEF DESCRIPTION OF THE INVENTION

The object of the invention is to develop a luminaire circuit board and a luminaire circuit board manufacturing method such that the above-mentioned disadvantage can be resolved. The object of the invention is achieved by a luminaire circuit board and a method for manufacturing a luminaire circuit board characterized by that, which is stated in the independent claims. The preferred embodiments of the invention are the object of the dependant claims.

The invention is based on the idea that, in addition to the LED components producing illumination, also extra LED components, not producing illumination are placed onto the luminaire circuit board. In case of a possible failure of a LED component, the failed LED component can be replaced by one of the extra LED components on the luminaire circuit board. The LED components to be used in connection with the manufacture of the luminaire circuit board can be selected from the same manufacturing batch with assurance, wherein the colour temperature produced by the components is within one MacAdam step. When a failed component is replaced by an extra component fastened to the luminaire circuit board, all the LED components in use on the luminaire circuit board are still from the same manufacturing batch and, therefore, also as close to each other as possible in colour temperature.

The advantage of a luminaire circuit board according to the invention is that the uniform colour temperature of the LED components of the luminaire circuit board can be assured even after the failure and replacement of one or more LED components. Removal from the board of the extra LED components fastened onto the luminaire circuit board in order to be connected to the electrical circuit can be implemented by simple means. Further, fastening of the component can also be implemented in a simple manner. By using a luminaire circuit board according to the invention, it is possible to eliminate the storage of spare part boards, because a failed luminaire circuit board can be repaired in a simpler manner than was previously possible.

BRIEF DESCRIPTION OF THE FIGURES

The invention is now described in more detail in connection with preferred embodiments, with reference to the accompanying drawings, in which:

FIG. 1 shows an example of the placement of components onto the circuit board; and FIG. 2 shows the circuit diagram of one embodiment according to the invention.

DETAILED DESCRIPTION OF THE INVENTION

FIG. 1 shows, on a principal level, the placement onto the circuit board of the components of the luminaire circuit board of one embodiment of the invention. The luminaire circuit board comprises a first set of light source components, such as LED components D1-D6 fastened onto the circuit board 1 and coupled to the circuit for producing illumination. As FIG. 1 shows only the placement of the components onto the circuit board, the circuit itself is not shown. The light source components of the first set are coupled to the circuit such that, as electric power is fed into the circuit, the light source components begin to produce light. The light source components are, for example, in series with each other or coupled to two or more parallel series circuits. Because the luminous flux produced by the light source components is proportional to the current flowing through the component, the circuit is implemented such that the desired current flows through the light source components in the circuit.

In the following, the invention is described such that the light source component used is a LED component. As is, in principle, shown in the figure, the LED components of the first set are placed onto the luminaire circuit board at even intervals in the longitudinal direction of the board. However, it is obvious that the LED components can also be placed as dispersed at irregular intervals onto the entire surface area of the board if the illumination application so requires. Correspondingly, the shape of the luminaire circuit board is not limited to the presented square shape, rather the shape may vary according to the required illumination application.

According to the invention, a luminaire circuit board further comprises a second set of light source components, such as, for example, LED components D11-D15, which have substantially the same colour temperature as the first set of light source components D1-D6 and which are fastened onto the circuit board as electrically isolated from said circuit. The second set of light source components, such as LED components D11-D15, are fastened onto the circuit board when the luminaire circuit board is manufactured, i.e. in the same process as the first set. Hence, the LED components of the second set and the LED components of the first set have substantially the same colour temperature. In accordance with FIG. 1, the second set of LED components is placed onto the edge of the luminaire circuit board into one group. The placement of the second set is not significant in terms of the function of the luminaire circuit board, because the LED components of the second set are not in active use.

The example of FIG. 1 shows that the first set has 6 LED components D1-D6 and the second set has 5 LED components D11-D15. As is presented above, the LED components of the first set are actively in use to produce light when a power supply is coupled to the circuit formed on the luminaire circuit board. The LED components of the second set are, in turn, located outside the circuit as electrically isolated from the circuit. When a power supply is coupled to the circuit of the luminaire circuit board, with which the LED components of the first set are integral, the LED components of the second set remain without current. The second set of LED components forms a LED component storage, from which LED components can be detached and placed integral with the circuit, if a LED component in the circuit ceases to function.

When the LED components of the first and second set are picked and placed onto the circuit board in the same manufacturing process or assembling process, the LED components are from the same manufacturing batch. Hence, the colour temperature of the components is substantially equal between the first and second set. As was presented above, the differences in colour temperatures between the LED components within one manufacturing batch are minimized by the component manufacturer. By using LED components of the same manufacturing batch, it is possible to assure that the LED components of the second set, being as spares, can be used to replace the LED components in the first set. It is presented above that the LED components of the first and second set are from the same manufacturing batch. It is also possible that the component manufacturer can implement matching of the colour temperatures of components also between manufacturing batches. Hence, the LED components do not necessarily need to be from the same manufacturing batch, if their colour temperatures are otherwise matched to correspond to each other.

According to one embodiment of the invention, the circuit board comprises means for forming a bypass channel for one or more light source components of the first set. Preferably, these means comprise fastening points for the bypass channel components such that a bypass channel component fastened to the fastening points forms a parallel current path for a light source component of the first set. The bypass channel component can be, for example, a resistive component, such as a resistor.

In a known manner, the conductors of the circuit are formed onto the circuit board by copper tracks, to which the electrical components are fastened integrally with the circuit. According to the embodiment, parallel with the LED components that are integral with the circuit, ready-made tracks are formed, to which bypass channel components can be coupled in order to form a bypass channel.

Bypass channel components can be coupled parallel with the light source components when a light source component is taken into use from the second set and installed integrally with the circuit to produce light. For many light source components, such as, for example, LED components, a decrease in the luminous flux produced by them is characteristic over their use. When a LED component that has been in use is replaced with a component stored in the second set, the luminous flux produced by this may differ from the luminous flux produced by the other components coupled to the circuit and, thus, produce a non-uniform impression. At the same time as a failed LED component is replaced with an unused component, parallel with this can be coupled a bypass channel component, which then decreases the current flowing through the LED component and, thus, the luminous flux produced by this. Using the resistance of one or more bypass channel components, it is thus possible to take into consideration the effects of aging and to bring about a uniform illumination from the luminaire circuit board.

According to the embodiment, onto the luminaire circuit board are arranged prepared sites for the bypass channel components. As a bypass channel component is coupled to a site like this, it is electrically coupled parallel with the light source component. FIG. 1 shows the bypass channel component sites R1-R6, which are located in the vicinity of the LED components.

FIG. 2 shows as an example three LED components D31-D33 coupled in series, parallel with one of which is coupled a resistor R31 as a bypass channel component to form a bypass channel. In connection with other LED components are schematically shown the coupling sites for parallel resistances, which can be used to form a parallel current path for other LED components.

If, for example, a damaged luminaire circuit board has reached 10,000 operating hours such that the luminous flux of the LED components in the electrical circuit has dropped approximately 10% from its original value, a portion of the current of the replacement LED component can be guided through a parallel resistance. For example, if the current of the LED components is set to 100 mA, then the resistance of the resistor to be coupled parallel should be approximately the transition voltage of the LED component divided by the current of the parallel resistance. The current of the parallel resistance is 10% of the current of the LED components, i.e. 10 mA, and assuming the transition voltage to be 3V, 300 Ohm is obtained as the magnitude of the resistance of the resistor to be coupled. It must be noted that the real value of the resistance does not need to be exactly the magnitude that was calculated, but instead close to the value in question.

Above is presented, how said bypass channel component is implemented by a resistive component, such as a resistor. According to one preferred embodiment of the invention, means for forming a bypass channel comprise a coupling, which is adapted to be modified such that, when the coupling is modified, said current path bypassing the light source component of the first set is formed. Modifying such a coupling can mean adding or removing a component, or replacing a component with another electrical component. The parallel circuit of the light source component, or a bypass channel, can also be implemented as a combination of various electrical components, or as semiconductor circuits developed for the purpose.

According to one preferred embodiment of the invention, the light source components of the second set are fastened to the luminaire circuit board from only one fastening point. As is stated above, the light source components of the second set function as spare parts and, therefore, are not in use for producing illumination. For this reason, it is preferable to fasten the light source components of the second set from only one fastening point to the board in order that they can simply, and without damaging the component, be detached from the board to be used integrally with the circuit Preferably, the light source components of the first and second set are surface mount components, which are fastened to the surface of the circuit board without holes drilled into the board. However, the invention is not limited to the surface mount components, rather all manners of fastening components onto the circuit board are possible within the scope of the invention.

The LED components of the second set, i.e. the LEDs functioning as spare parts, are fastened to the circuit board by soldering or gluing. In a typical circuit board manufacturing process, the electrical components are picked and placed onto the circuit board and fastened integrally with the circuit by soldering. Because the LED components of the second set are not integral with the electrical circuit, electricity-conducting tin or other soldering material is not required for fastening them. If the manufacturing process of the circuit board allows gluing of the components or parts, the LED components functioning as spare parts can also be fastened by gluing.

FIG. 1 shows a component placement of the luminaire circuit board, which shows only the places of the light source components, such as the LED components and said resistive components. However, it is obvious that the luminaire circuit board also contains other electrical components, such as connectors, capacitors, resistors, diodes and switches to create a functional entity. The current to be fed into the circuit of the light source components can be, by nature, direct current or modulated current, such as, for example, the pulse width modulated (PWM) current often used in connection with LED components.

The first set of light source components on the luminaire circuit board comprises two or more light source components, which produce illumination from the luminaire circuit board. The second set of light source components on the luminaire circuit board comprises one or more light source components, which can be used to replace one or more failed light source components of the illumination-producing light source components of the first set. While striving for a long service life of the luminaire circuit board, the number of the spare part components formed by the second set can be selected to be large, wherein failed illuminative light source components can be replaced several times.

A luminaire circuit board according to the invention is adapted to be installed in connection with the cover and frame of a luminaire, wherein a luminaire is obtained. The luminaire circuit board is further adapted to be coupled to a power supply. The power supply can be brought to the luminaire circuit board by conductors directly connected to the board, connectors or by a wireless power supply such that the power supply has a known voltage or current, and the circuit configured on the luminaire circuit board takes care of the current supply to the light source components.

Presented above are the structure and operation of a solution according to the invention primarily such that the light source components are LED components. In addition to LED components, the light source components can be, for example, a laser component, an OLED component or a light-producing membrane (field-induced polymer electroluminescent technology).

It is obvious to the skilled person in the art that, as technology develops, the basic idea of the invention can be implemented in various ways. The invention and its embodiments are therefore not limited to only the examples presented above, rather they may vary within the scope of the claims.

The invention claimed is:

1. A luminaire circuit board comprising:
   a first set of light source components fastened onto a circuit board and coupled to a circuit for producing illumination,
   a second set of light source components, which have a colour temperature that is substantially the same as a colour temperature of the light source components of the first set such that the colour temperatures of the first and second sets of light source components are within 3 MacAdam steps;
   wherein the light source components of said second set of light source components are fastened onto the circuit board and electrically isolated from said circuit, and wherein the light source components of said second set of light source components are detachable for use to replace a failed light source component of the first set.

2. A luminaire circuit board according to claim 1, wherein the light source components of the second set of light source components are fastened to the circuit board at one or more fastening points.

3. A luminaire circuit board according to claim 1, wherein the circuit board comprises a preparatory bypass channel for one or more of the light source components of the first set of light source components.

4. A luminaire circuit board according to claim 3, wherein said preparatory bypass channel comprises fastening points for bypass channel components such that a bypass channel component fastened to said fastening points forms a parallel current path for a light source component of the first set of light source components.

5. A luminaire circuit board according to claim 3, wherein said preparatory bypass channel comprises a coupling, which is adapted to be modified such that, when the coupling is modified, a parallel current path for at least one light source component of the first set of light source components is formed.

6. A luminaire circuit board according to claim 3, wherein the circuit board comprises fastening points for bypass channel components, wherein a parallel current path can be formed for any light source component of the first set of light source components through such bypass channel components and a current of the bypass channel is adjustable.

7. A luminaire circuit board according to claim 1, wherein the first set of light source components comprises two or more light source components and the second set of light source components comprises one or more light source components.

8. A luminaire circuit board according to claim 1, wherein the luminaire circuit board is adapted to be coupled to a power supply and is adapted to be installed in connection with a frame and a cover of a luminaire.

9. A luminaire circuit board according to claim 1, wherein the light source components of said first and second set of light source components are selected from a group consisting of a LED component, an OLED component, a laser component, and a light-producing membrane.

10. A method for manufacturing a luminaire circuit board, the method comprising:
fastening a first set of light source components onto the circuit board to form a circuit for producing illumination,
fastening a second set of light source components onto the circuit board such that the light source components of the second set of light source components are electrically isolated from said circuit, wherein the light source components of the second set of light source components have substantially a same colour temperature as the light source components of the first set of light source components such that the colour temperatures of the first and second sets of light source components are within 3 MacAdam steps, and
making the light source components of the second set of light source components detachable for replacing a failed light source component of the first set of light source components.

11. A method according to claim 10, wherein the fastening of the light source components of the second set of light source components comprises fastening the light source components of the second set of light source components from one or more fastening points.

12. A method according to claim 10 comprising:
forming onto the circuit board fastening points for bypass channel components such that a bypass channel component fastened to a fastening point forms a parallel current path for a light source component of the first set.

* * * * *